(12) United States Patent
Komukai et al.

(10) Patent No.: US 7,858,465 B2
(45) Date of Patent: Dec. 28, 2010

(54) SEMICONDUCTOR DEVICE COMPRISING TRANSISTOR AND CAPACITOR AND METHOD OF MANUFACTURING THE SAME

(75) Inventors: Toshiaki Komukai, Kawasaki (JP); Hideaki Harakawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 153 days.

(21) Appl. No.: 12/031,297

(22) Filed: Feb. 14, 2008

(65) Prior Publication Data
US 2008/0197398 A1  Aug. 21, 2008

(30) Foreign Application Priority Data
Feb. 19, 2007  (JP) ................................ 2007-38327

(51) Int. Cl.
*H01L 21/8238*  (2006.01)
(52) U.S. Cl. .................... 438/210; 438/171; 438/190; 438/238; 438/329; 438/381; 438/396; 438/397; 438/398; 438/399
(58) Field of Classification Search .................. 257/7, 257/296, 306, E25.029, E21.576; 438/199, 438/239, 253, 256, 396–399, 171, 190, 210, 438/238, 329, 381
See application file for complete search history.

(56) References Cited

U.S. PATENT DOCUMENTS

| | | | | |
|---|---|---|---|---|
| 4,933,743 | A * | 6/1990 | Thomas et al. ............... | 257/742 |
| 6,146,931 | A * | 11/2000 | Nunokawa et al. .......... | 438/172 |
| 6,376,370 | B1 * | 4/2002 | Farrar .......................... | 438/678 |
| 6,569,717 | B1 * | 5/2003 | Murade ....................... | 438/149 |
| 6,664,580 | B2 * | 12/2003 | Jao .............................. | 257/296 |
| 6,872,966 | B2 * | 3/2005 | Akiyama et al. ............. | 257/14 |
| 6,958,291 | B2 * | 10/2005 | Yu et al. ...................... | 438/637 |
| 7,064,369 | B2 | 6/2006 | Koh | |
| 7,420,227 | B2 * | 9/2008 | Chang et al. ................ | 257/197 |
| 2005/0139887 | A1 * | 6/2005 | Song .......................... | 257/296 |
| 2005/0205918 | A1 * | 9/2005 | Abiko ........................ | 257/303 |
| 2006/0118823 | A1 * | 6/2006 | Parikh et al. ................ | 257/194 |

FOREIGN PATENT DOCUMENTS

JP  2000-357773  12/2000

OTHER PUBLICATIONS

S. M. Sze. Semiconductor Devices. Physics and Technology, 2nd Edition. (C) 2002 John Wiley and Sons, p. 398.*
M. Annaratone. Digital CMOS Circuit Design. (C) 1986, Kluwer Academic Publishers, pp. 62-63.*

* cited by examiner

*Primary Examiner*—N Drew Richards
*Assistant Examiner*—Jae Lee
(74) *Attorney, Agent, or Firm*—Finnegan, Henderson, Farabow, Garrett & Dunner, L.L.P.

(57) ABSTRACT

A semiconductor device according to an embodiment of the present invention includes: a transistor including, a gate insulator formed of an insulating layer deposited on a substrate, and a gate electrode formed of an electrode layer deposited on the insulating layer; a capacitor including, a first capacitor electrode formed of the electrode layer, a first capacitor insulator formed on the first capacitor electrode, a second capacitor electrode formed on the first capacitor insulator, a second capacitor insulator formed on the second capacitor electrode, and a third capacitor electrode formed on the second capacitor insulator; and line patterns which are in contact with a contact plug for the transistor, a contact plug for the first capacitor electrode, a contact plug for the second capacitor electrode, and the third capacitor electrode.

17 Claims, 12 Drawing Sheets

SEMICONDUCTOR DEVICE COMPRISING TRANSISTOR AND CAPACITOR AND METHOD OF MANUFACTURING THE SAME

CROSS REFERENCE TO RELATED APPLICATIONS

This application is based upon and claims the benefit of priority from the prior Japanese Patent Application No. 2007-38327, filed on Feb. 19, 2007, the entire contents of which are incorporated herein by reference.

BACKGROUND OF THE INVENTION

1. Field of the Invention

The present invention relates to a semiconductor device and a method of manufacturing the same.

2. Background Art

When a transistor and a capacitor are mounted on an identical substrate, difficulty in contact processing is often a problem (JP-A 2000-357773 (KOKAI)). This is because an aspect difference of a contact hole for the transistor is often substantially different from an aspect difference of a contact hole for the capacitor. When the difference between these aspect differences is large, it is difficult to simultaneously process these contact holes, so that it is necessary to process these contact holes separately. However, such contact processing deteriorates TAT (Turn Around Time) of a semiconductor manufacturing process.

As the height of the capacitor increases, the difference between the aspect differences becomes larger. Therefore, as the height of the capacitor increases, it becomes more difficult to simultaneously process the contact holes.

SUMMARY OF THE INVENTION

An embodiment of the present invention is, for example, a method of manufacturing a semiconductor device, the method including: depositing a first insulating layer on a substrate; depositing a first electrode layer on the first insulating layer; depositing a second insulating layer on the first electrode layer; depositing a second electrode layer on the second insulating layer; depositing a third insulating layer on the second electrode layer; depositing a third electrode layer on the third insulating layer; processing the first to third insulating layers and the first to third electrode layers to form a transistor including, a gate insulator formed of the first insulating layer, and a gate electrode formed of the first electrode layer, and a capacitor including, a first capacitor electrode formed of the first electrode layer, a first capacitor insulator formed of the second insulating layer, a second capacitor electrode formed of the second electrode layer, a second capacitor insulator formed of the third insulating layer, and a third capacitor electrode formed of the third electrode layer; depositing an inter layer dielectric that covers the transistor and the capacitor; forming, in the inter layer dielectric, a contact hole for the transistor, a contact hole for the first capacitor electrode, and a contact hole for the second capacitor electrode; embedding contact plug material in the contact hole for the transistor, the contact hole for the first capacitor electrode, and the contact hole for the second capacitor electrode; planarizing the contact plug material to form a contact plug for the transistor, a contact plug for the first capacitor electrode, and a contact plug for the second capacitor electrode and to expose the third capacitor electrode; depositing a line layer that covers the contact plug for the transistor, the contact plug for the first capacitor electrode, the contact plug for the second capacitor electrode, and the third capacitor electrode; and processing the line layer to form line patterns formed of the line layer.

Another embodiment of the present invention is, for example, a semiconductor device including: a transistor including, a gate insulator formed of an insulating layer deposited on a substrate, and a gate electrode formed of an electrode layer deposited on the insulating layer; a capacitor including, a first capacitor electrode formed of the electrode layer, a first capacitor insulator formed on the first capacitor electrode, a second capacitor electrode formed on the first capacitor insulator, a second capacitor insulator formed on the second capacitor electrode, and a third capacitor electrode formed on the second capacitor insulator; a contact plug for the transistor; a contact plug for the first capacitor electrode; a contact plug for the second capacitor electrode; and line patterns which are in contact with the contact plug for the transistor, the contact plug for the first capacitor electrode, the contact plug for the second capacitor electrode, and the third capacitor electrode.

DESCRIPTION OF THE EMBODIMENTS

First Embodiment

Figure 1:
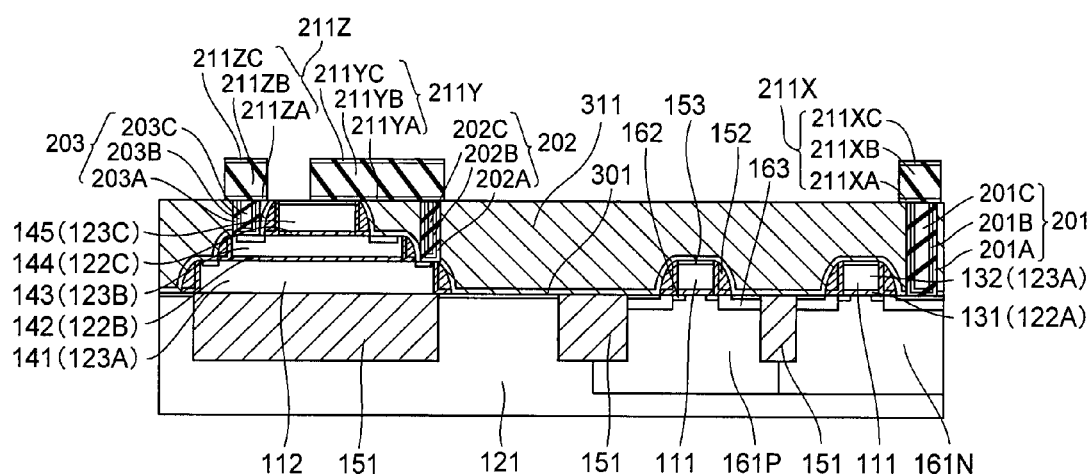
FIG. 1 is a side sectional view of a semiconductor device according to a first embodiment.

FIG. 1 is a side sectional view of a semiconductor device 101 according to a first embodiment. The semiconductor device 101 in FIG. 1 includes transistors 111 which are MOSFETs, and includes a capacitor 112 formed by three capacitor electrode layers and two capacitor insulating layers to control an occupied area thereof.

The semiconductor device 101 includes a substrate 121, a first insulating layer 122A deposited on the substrate 121, a first electrode layer 123A deposited on the first insulating layer 122A, a second insulating layer 122B deposited on the first electrode layer 123A, a second electrode layer 123B deposited on the second insulating layer 122B, a third insulating layer 122C deposited on the second electrode layer 123B, and a third electrode layer 123C deposited on the third insulating layer 122C.

The substrate 121 in this embodiment is a semiconductor substrate, specifically, a silicon substrate. The first insulating layer 122A in this embodiment is a silicon oxide layer. Each of the second and third insulating layers 122B and 122C in this embodiment is a three-layer insulator including a silicon oxide layer, a silicon nitride layer, and a silicon oxide layer. Each of the first to third electrode layers 123A to 123C in this embodiment is a polysilicon layer or a metal layer.

Each of the transistors 111 includes a gate insulator 131 formed of the first insulating layer 122A, and a gate electrode 132 formed of the first electrode layer 123A. The capacitor 112 includes a first capacitor electrode 141 formed of the first electrode layer 123A, a first capacitor insulator 142 formed of the second insulating layer 122B, a second capacitor electrode 143 formed of the second electrode layer 123B, a second capacitor insulator 144 formed of the third insulating layer 122C, and a third capacitor electrode 145 formed of the third electrode layer 123C.

The semiconductor device 101 further includes a contact plug 201 for the transistors 111, a contact plug 202 for the first capacitor electrode 141, and a contact plug 203 for the second capacitor electrode 143. The semiconductor device 101 further includes line patterns 211 which are in contact with the contact plug 201 for the transistors 111, the contact plug 202 for the first capacitor electrode 141, the contact plug 203 for the second capacitor electrode 143, and the third capacitor electrode 145. The line patterns 211 include a line pattern 211X which is in contact with the contact plug 201, a line pattern 211Y which is in contact with the contact plug 202 and the third capacitor electrode 145, and a line pattern 211Z which is in contact with the contact plug 203.

Each of the contact plugs 201, 202, and 203 has a three-layer laminated structure (Ti layer/TiN layer/W layer) from its bottom surface and sidewall surfaces. The Ti layers are denoted by 201A, 202A, and 203A. The TiN layers are denoted by 201B, 202B, and 203B. The W layers are denoted by 201C, 202C, and 203C. Each of the line patterns 211X, 211Y, and 211Z has a three-layer laminated structure (first barrier metal layer/metal layer/second barrier metal layer) from its bottom surface. The first barrier metal layers are denoted by 211XA, 211YA, and 211ZA. The metal layers are denoted by 211XB, 211YB, and 211ZB. The second barrier metal layers are denoted by 211XC, 211YC, and 211ZC. The first barrier metal layers in this embodiment are TiN layers. The metal layers in this embodiment are Al (aluminum) layers. The second barrier metal layers in this embodiment are TiN layers.

The first capacitor electrode 141 and the third capacitor electrode 145 constitute one electrode of the capacitor 112, and the second capacitor electrode 143 constitutes the other electrode of the capacitor 112. The first capacitor electrode 141 is supplied with potential from the line pattern 211Y via the contact plug 202. The second capacitor electrode 143 is supplied with potential from the line pattern 211Z via the contact plug 203. The third capacitor electrode 145 is supplied with potential from the line pattern 211Y directly. The first capacitor electrode 141 and the third capacitor electrode 145 are supplied with the same potential from the line pattern 211Y.

FIGS. 2A to 2H illustrate a manufacturing process of the semiconductor device 101 according to the first embodiment.

Figure 2A:
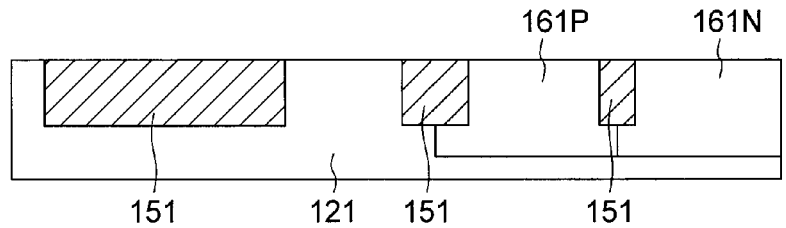
FIGS. 2A to 2H illustrate a manufacturing process of the semiconductor device according to the first embodiment.

First, an isolation layer 151 is formed on a substrate 121 which is a silicon substrate. The isolation layer 151 in this embodiment is an STI layer of silicon oxide. Then, B ions are implanted into an nMOS region, and P ions are implanted into a pMOS region. Consequently, a p-well 161P and an n-well 161N are formed in the substrate 121 (FIG. 2A).

Figure 2B:
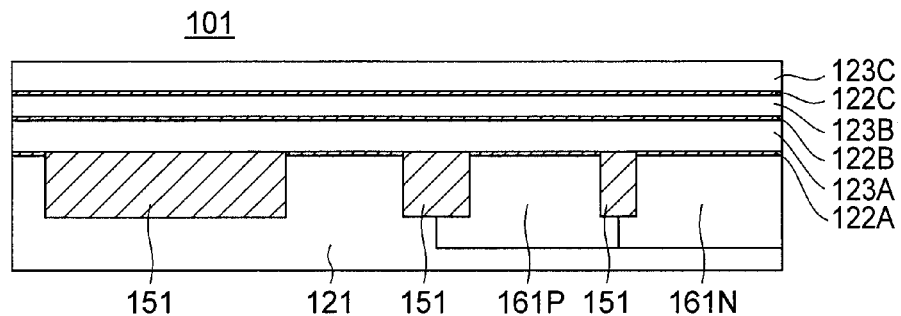

Next, a first insulating layer 122A of silicon oxide is deposited on the substrate 121, and a first electrode layer 123A of polysilicon is deposited on the first insulating layer 122A. Then, a resist mask is patterned by lithography, and phosphorus is doped in the first electrode layer 123A by ion implantation. Consequently, the value of the resistance of a first capacitor electrode formed later is adjusted (FIG. 2B).

Next, a second insulating layer 122B which includes a silicon oxide layer, a silicon nitride layer, and a silicon oxide layer deposited successively, is formed on the first electrode layer 123A, and a second electrode layer 123B of polysilicon is deposited on the second insulating layer 122B. Then, a resist mast is patterned by lithography, and phosphorus is doped in the second electrode layer 123B by ion implantation. Consequently, the value of the resistance of a second capacitor electrode formed later is adjusted (FIG. 2B).

Next, a third insulating layer 122C which includes a silicon oxide layer, a silicon nitride layer, and a silicon oxide layer deposited successively, is formed on the second electrode layer 123B, and a third electrode layer 123C of polysilicon is deposited on the third insulating layer 122C. Then, a resist mast is patterned by lithography, and phosphorus is doped in the third electrode layer 123C by ion implantation. Consequently, the value of the resistance of a third capacitor electrode formed later is adjusted (FIG. 2B).

Figure 2C:
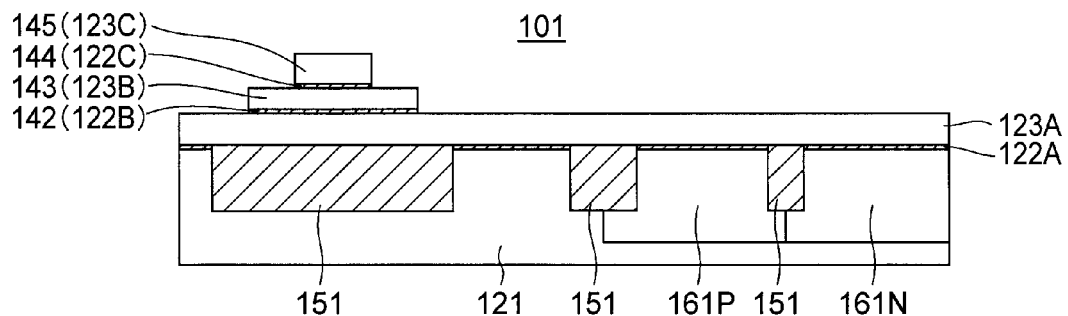

Next, the third electrode layer 123C is patterned by lithography and anisotropic etching. Consequently, the third electrode layer 123C is processed, and a third capacitor electrode 145 is formed from the third electrode layer 123C. Then, the exposed third insulating layer 122C is removed by wet etching using HF chemical and phosphoric acid. Consequently, the third insulating layer 122C is processed, and a second capacitor insulator 144 is formed (FIG. 2C).

Next, the second electrode layer 123B is patterned by lithography and anisotropic etching. Consequently, the second electrode layer 123B is processed, and a second capacitor electrode 143 is formed from the second electrode layer 123B. Then, the exposed second insulating layer 122B is removed by wet etching using HF chemical and phosphoric acid. Consequently, the second insulating layer 122B is processed, and a first capacitor insulator 142 is formed (FIG. 2C).

Figure 2D:
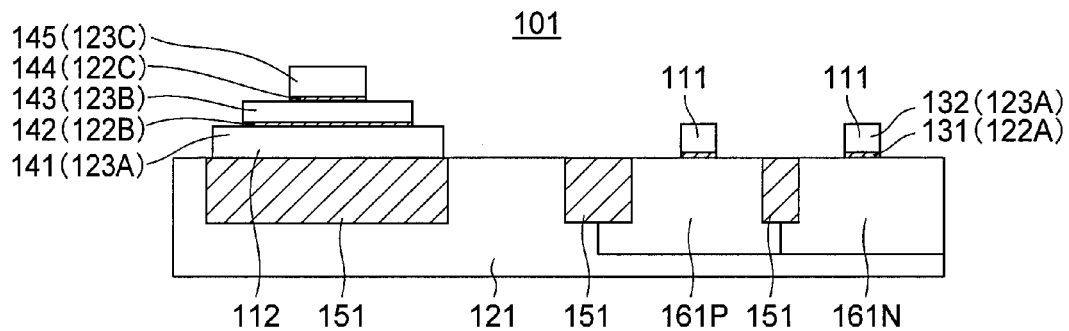

Next, the first electrode layer 123A is patterned by lithography and anisotropic etching. Consequently, the first electrode layer 123A is processed, and a first capacitor electrode 141 and gate electrodes 132 are formed from the first electrode layer 123A. Then, the exposed first insulating layer 122A is removed by wet etching using HF chemical. Consequently, the first insulating layer 122A is processed, and gate insulators 131 are formed (FIG. 2D).

According to the process described above, transistors 111 are formed on the wells 161, and a capacitor 112 is formed on the isolation layer 151. In FIG. 2D, a pMOSFET is formed on the p-well 161P, and an nMOSFET is formed on the n-well 161N.

Figure 2E:
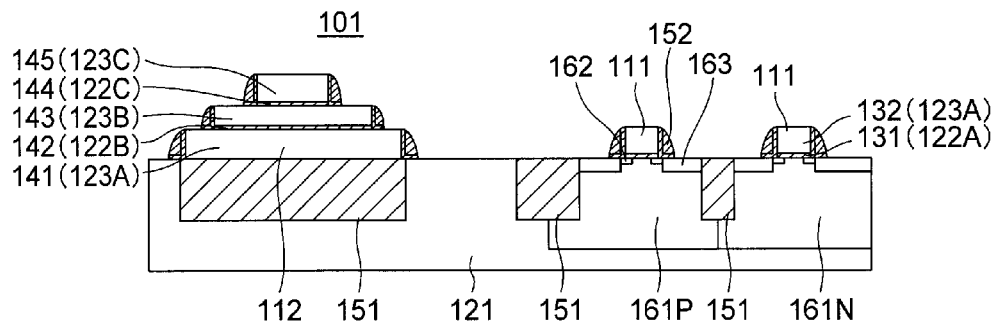

Next, impurities are led into the wells 161 by ion implantation using, as a mask, the gate electrodes 132. Then, extension diffusion layers 162 are formed in the wells 161 by annealing using RTP technique. Then, a silicon nitride layer is deposited, and sidewall spacers 152 of the silicon nitride layer are formed on sidewalls of the gate electrodes 132. Then, impurities are led into the wells 161 by ion implantation using, as a mask, the gate electrodes 132 and the sidewall spacers 152. Then, source/drain diffusion layers 163 are formed in the wells 161 by annealing using RTP technique (FIG. 2E).

Figure 2F:
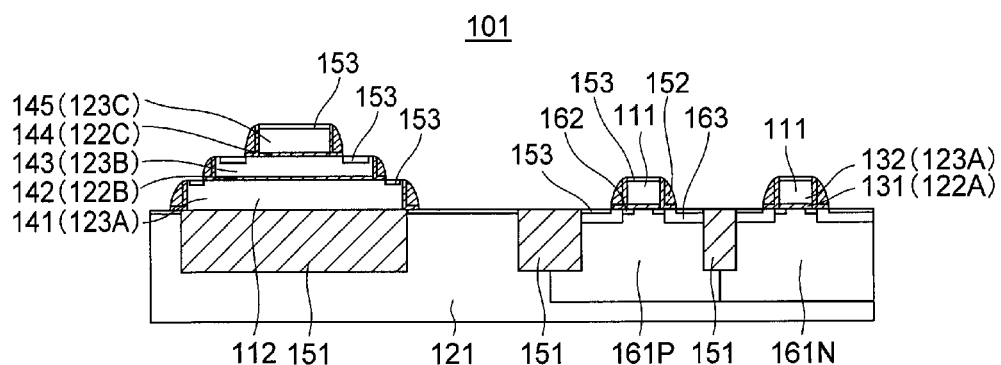

Next, the source/drain diffusion layers 163, the gate electrodes 132, the first capacitor electrode 141, the second capacitor electrode 143, and the third capacitor electrode 145 are exposed by wet etching using HF chemical. Then, a metal layer of cobalt or the like is deposited on exposed surfaces of these layers and electrodes, and is annealed at temperature at which reaction between the exposed surfaces and the metal layer occurs. Consequently, metal silicide layers 153 are formed (self-aligned) on the surfaces of the source/drain diffusion layers 163, the gate electrodes 132, the first capacitor electrode 141, the second capacitor electrode 143, and the third capacitor electrode 145 (FIG. 2F).

Figure 2G:
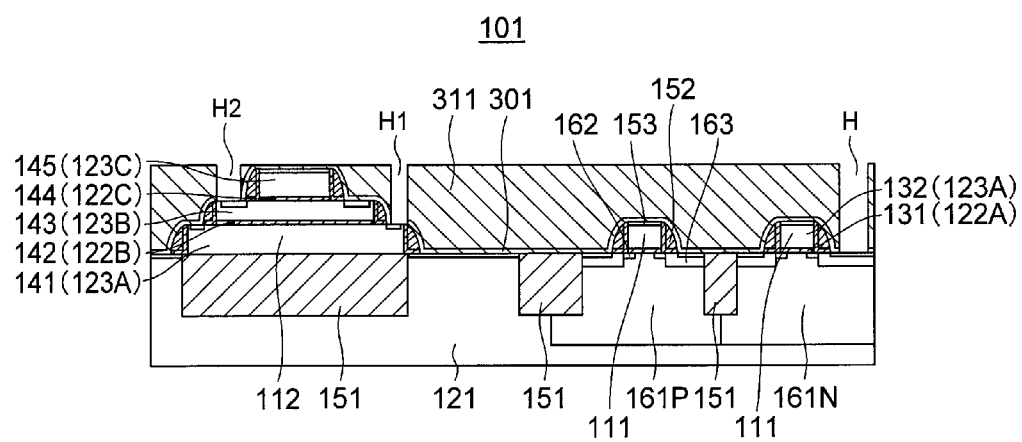

Next, an etch stopper 301 of silicon nitride and an inter layer dielectric 311 of silicon oxide are deposited over the entire surface successively. Consequently, the transistors 111 and the capacitor 112 are covered by the etch stopper 301 and the inter layer dielectric 311. Then, the inter layer dielectric 311 is planarized by CMP (chemical mechanical polishing). Then, a contact hole for the transistors 111 (H), a contact hole for the first capacitor electrode 141 (H1), and a contact hole for the second capacitor electrode 143 (H2) are simultaneously formed in the inter layer dielectric 311 by lithography and anisotropic etching. The anisotropic etching is continued until the etch stopper 301 is exposed. Then, the etch stopper 301 exposed in the contact holes H, H1, and H2 is removed by anisotropic etching. The anisotropic etching is continued until the metal silicide layers 153 are exposed. Consequently, the contact holes H, H1, and H2 are completed (FIG. 2G).

Figure 2H:
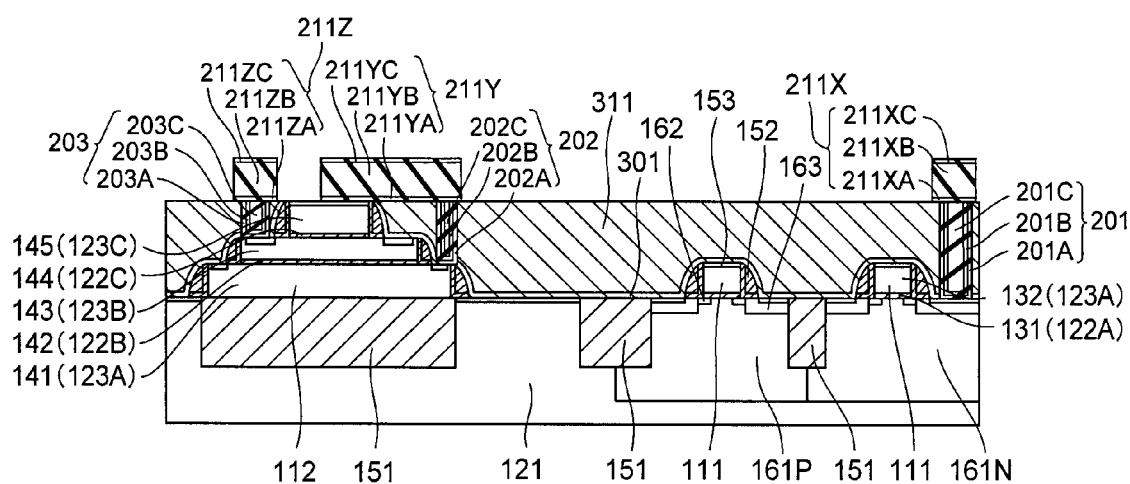

Next, contact plug material is embedded in the contact hole for the transistors 111 (H), the contact hole for the first capacitor electrode 141 (H1), and the contact hole for the second capacitor electrode 143 (H2). The contact plug material has a three-layer structure including a Ti layer deposited by sputtering, a TiN layer deposited by CVD, and a W layer deposited by CVD. Then, the contact plug material is planarized by CMP. Consequently, a contact plug 201 for the transistors 111, a contact plug 202 for the first capacitor electrode 141, and a contact plug 203 for the second capacitor electrode 143 are formed, and the third capacitor electrode 145 (specifically, the metal silicide layer 153 of the third capacitor electrode 145) is exposed (FIG. 2H).

In this embodiment, the metal silicide layer 153 is formed on the surface of the third capacitor electrode 145. However, according to another embodiment, the metal silicide layer 153 does not have to be formed on the surface of the third capacitor electrode 145. This is because CMP polishing speed for polysilicon included in the third capacitor electrode 145 is lower than CMP polishing speed for silicon oxide included in the inter layer dielectric 311.

Next, a line layer is deposited over the entire surface. Consequently, the contact plug 201 for the transistors 111, the contact plug 202 for the first capacitor electrode 141, the contact plug 203 for the second capacitor electrode 143, and the third capacitor electrode 145 are covered by the line layer. The line layer has a three-layer structure including a first TiN layer deposited by CVD, an Al layer deposited by sputtering, and a second TiN layer deposited by CVD. Then, the line layer is patterned by lithography and anisotropic etching. Consequently, the line layer is processed, and line patterns 211 (211X to 211Z) are formed from the line layer (FIG. 2H).

In this way, the transistors 111 and the capacitor 112 are mounted on the identical substrate 121. In this embodiment, the capacitor 112 is a multilayer capacitor including three capacitor electrode layers and two capacitor insulating layers. Compared with a single-layer capacitor which includes two capacitor electrode layers and one capacitor insulating layer, the multilayer capacitor 112 has a smaller occupied area but has a larger height. Therefore, if the multilayer capacitor 112 having a larger height than the single-layer capacitor is manufactured by a conventional method (see JP-A 2000-357773 (KOKAI)), difficulty in contact processing comes to be a problem.

Therefore, in this embodiment, the third capacitor electrode 145 and the line patterns 211 are directly connected. In other words, the third capacitor electrode 145 and the line patterns 211 are connected without a contact plug. Therefore, in this embodiment, in advance of forming the contact holes for the transistors 111 and the capacitor 112 (H, H1, and H2), it is possible to planarize the inter layer dielectric 311 until the third capacitor electrode 145 is exposed, or until immediately before the third capacitor electrode 145 is exposed (see FIG. 2G). Consequently, in this embodiment, it is possible to reduce the differences of aspect differences between the contact hole H and the contact holes H1 and H2. Consequently, in this embodiment, it is possible to process the contact holes H, H1, and H2 simultaneously, which can simplify the manufacturing process of the semiconductor device 101 (see FIG. 2G).

Here, the case in which the planarization is performed until the third capacitor electrode 145 is exposed, and the case in which the planarization is performed until immediately before the third capacitor electrode 145 is exposed, are compared. Compared with the latter case, the former case has an advantage that the differences of aspect differences can be more reduced. Compared with the former case, the latter case has an advantage that it is less likely to damage the third capacitor electrode 145. Since such a damage is anticipated, an inter layer dielectric covering a capacitor conventionally has a relatively large thickness. In the former case, it is also possible that, in depositing the third electrode layer 123C, the thickness of the third electrode layer 123 is set larger than the design value of the thickness of the third capacitor electrode 145, and in the planarization, the surface of the third capacitor electrode 145 is polished to some extent.

This embodiment is also applicable to a multilayer capacitor including N+1 capacitor electrode layers and N capacitor insulating layers (N is an integer larger than 2). In this case, the highest capacitor electrode is equivalent to the third capacitor electrode 145, and other N capacitor electrodes are equivalent to the first and second capacitor electrodes 141 and 143. In this case, the highest capacitor electrode and the line patterns are connected without a contact plug, and the other N capacitor electrodes and the line patterns are connected via contact plugs.

Second and third embodiments will be hereinafter explained. Since these embodiments are modifications of the first embodiment, differences from the first embodiment will be mainly explained.

Second Embodiment

Figure 3:
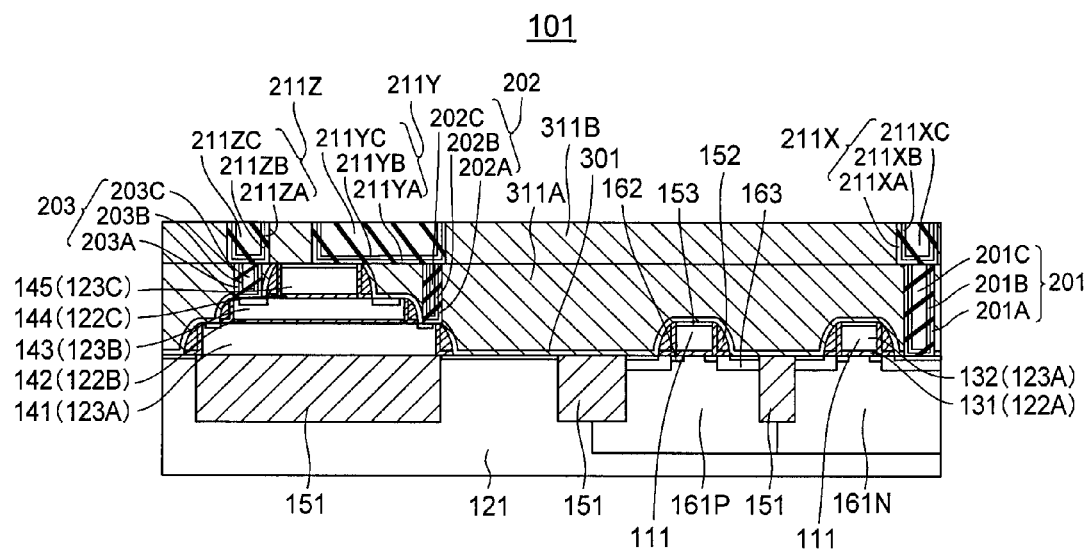
FIG. 3 is a side sectional view of a semiconductor device according to a second embodiment.

FIG. 3 is a side sectional view of a semiconductor device 101 according to a second embodiment. The semiconductor device 101 in FIG. 3 includes transistors 111 and a capacitor 112.

The semiconductor device 101 includes a substrate 121, a first insulating layer 122A, a first electrode layer 123A, a second insulating layer 122B, a second electrode layer 123B, a third insulating layer 122C, and a third electrode layer 123C.

Each of the transistors 111 includes a gate insulator 131 formed of the first insulating layer 122A, and a gate electrode 132 formed of the first electrode layer 123A. The capacitor 112 includes a first capacitor electrode 141 formed of the first electrode layer 123A, a first capacitor insulator 142 formed of the second insulating layer 122B, a second capacitor electrode 143 formed of the second electrode layer 123B, a second capacitor insulator 144 formed of the third insulating layer 122C, and a third capacitor electrode 145 formed of the third electrode layer 123C.

The semiconductor device 101 further includes a contact plug 201 for the transistors 111, a contact plug 202 for the first capacitor electrode 141, and a contact plug 203 for the second capacitor electrode 143. The semiconductor device 101 further includes line patterns 211 which are in contact with the contact plug 201 for the transistors 111, the contact plug 202 for the first capacitor electrode 141, the contact plug 203 for the second capacitor electrode 143, and the third capacitor electrode 145. The line patterns 211 include a line pattern 211X which is in contact with the contact plug 201, a line pattern 211Y which is in contact with the contact plug 202 and the third capacitor electrode 145, and a line pattern 211Z which is in contact with the contact plug 203.

Each of the contact plugs 201, 202, and 203 has a three-layer laminated structure (Ti layer/TiN layer/W layer) from its bottom surface and sidewall surfaces. The Ti layers are denoted by 201A, 202A, and 203A. The TiN layers are denoted by 201B, 202B, and 203B. The W layers are denoted by 201C, 202C, and 203C. Each of the line patterns 211X, 211Y, and 211Z has a three-layer laminated structure (barrier metal layer/seed layer/metal layer) from its bottom surface and sidewall surfaces. The barrier metal layers are denoted by 211XA, 211YA, and 211ZA. The seed layers are denoted by 211XB, 211YB, and 211ZB. The metal layers are denoted by 211XC, 211YC, and 211ZC. The barrier metal layers in this embodiment are Ta (tantalum) layers. The seed layers in this embodiment are Cu (copper) layers. The metal layers in this embodiment are Cu (copper) layers. The line patterns 211 in this embodiment are single damascene lines.

The first capacitor electrode 141 and the third capacitor electrode 145 constitute one electrode of the capacitor 112, and the second capacitor electrode 143 constitutes the other electrode of the capacitor 112. The first capacitor electrode 141 is supplied with potential from the line pattern 211Y via the contact plug 202. The second capacitor electrode 143 is supplied with potential from the line pattern 211Z via the contact plug 203. The third capacitor electrode 145 is supplied with potential from the line pattern 211Y directly. The first capacitor electrode 141 and the third capacitor electrode 145 is supplied with the same potential from the line pattern 211Y.

FIGS. 4A to 4I illustrate a manufacturing process of the semiconductor device 101 according to the second embodiment.

Figure 4A:
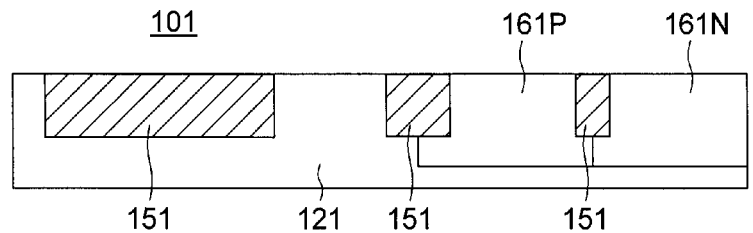
FIGS. 4A to 4I illustrate a manufacturing process of the semiconductor device according to the second embodiment.

First, an isolation layer 151 is formed on a substrate 121 which is a silicon substrate. Then, a p-well 161P and an n-well 161N are formed in the substrate 121 (FIG. 4A).

Figure 4B:
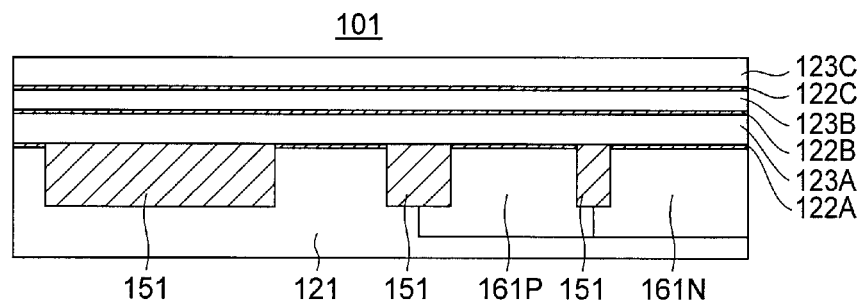

Next, a first insulating layer 122A of silicon oxide is deposited on the substrate 121, and a first electrode layer 123A of polysilicon is deposited on the first insulating layer 122A. Then, a second insulating layer 122B which includes a silicon oxide layer, a silicon nitride layer, and a silicon oxide layer deposited successively, is formed on the first electrode layer 123A, and a second electrode layer 123B of polysilicon is deposited on the second insulating layer 122B. Then, a third insulating layer 122C which includes a silicon oxide layer, a silicon nitride layer, and a silicon oxide layer deposited successively, is formed on the second electrode layer 123B, and a third electrode layer 123C of polysilicon is deposited on the third insulating layer 122C (FIG. 4B).

Figure 4C:
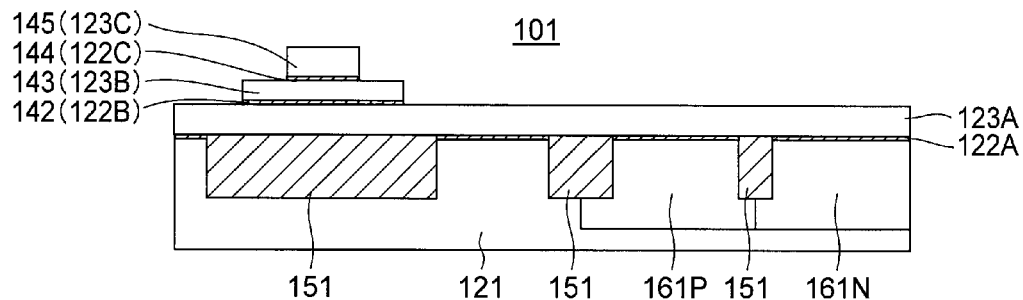

Next, the third electrode layer 123C is patterned by lithography and anisotropic etching. Consequently, the third electrode layer 123C is processed, and a third capacitor electrode 145 is formed from the third electrode layer 123C. Then, the exposed third insulating layer 122C is removed by wet etching using HF chemical and phosphoric acid. Consequently, the third insulating layer 122C is processed, and a second capacitor insulator 144 is formed (FIG. 4C).

Next, the second electrode layer 123B is patterned by lithography and anisotropic etching. Consequently, the second electrode layer 123B is processed, and the second capacitor electrode 143 is formed from the second electrode layer 123B. Then, the exposed second insulating layer 122B is removed by wet etching using HF chemical and phosphoric acid. Consequently, the second insulating layer 122B is processed, and a first capacitor insulator 142 is formed (FIG. 4C).

Figure 4D:
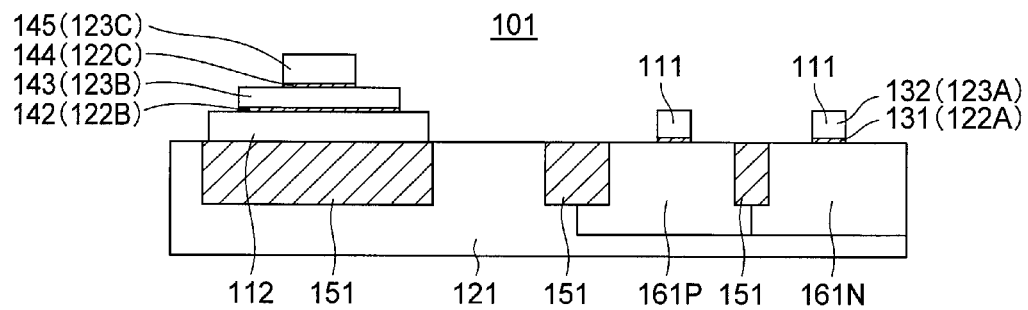

Next, the first electrode layer 123A is patterned by lithography and anisotropic etching. Consequently, the first electrode layer 123A is processed, and a first capacitor electrode 141 and gate electrodes 132 are formed from the first electrode layer 123A. Then, the exposed first insulating layer 122A is removed by wet etching using HF chemical. Consequently, the first insulating layer 122A is processed, and gate insulators 131 are formed (FIG. 4D).

According to the process described above, transistors 111 are formed on the wells 161, and a capacitor 112 is formed on the isolation layer 151. In FIG. 4D, a pMOSFET is formed on the p-well 161P, and an nMOSFET is formed on the n-well 161N.

Figure 4E:
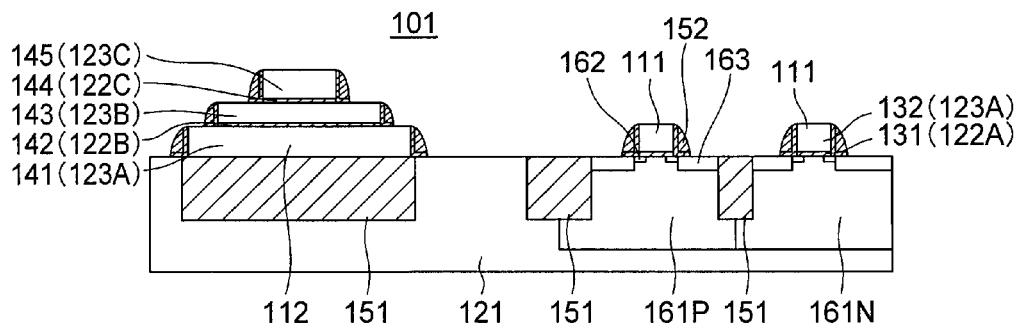

Next, extension diffusion layers 162 are formed in the wells 161. Then, sidewall spacers 152 are formed. Then, source/drain diffusion layers 163 are formed in the wells 161 (FIG. 4E).

Figure 4F:
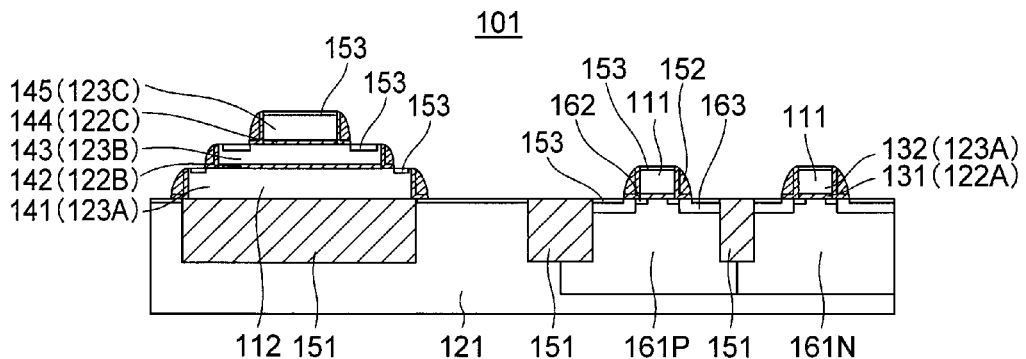

Next, the source/drain diffusion layers 163, the gate electrodes 132, the first capacitor electrode 141, the second capacitor electrode 143, and the third capacitor electrode 145 are exposed by wet etching using HF chemical. Then, metal silicide layers 153 are formed (self-aligned) on the surfaces of the source/drain diffusion layers 163, the gate electrodes 132, the first capacitor electrode 141, the second capacitor electrode 143, and the third capacitor electrode 145 (FIG. 4F).

Figure 4G:
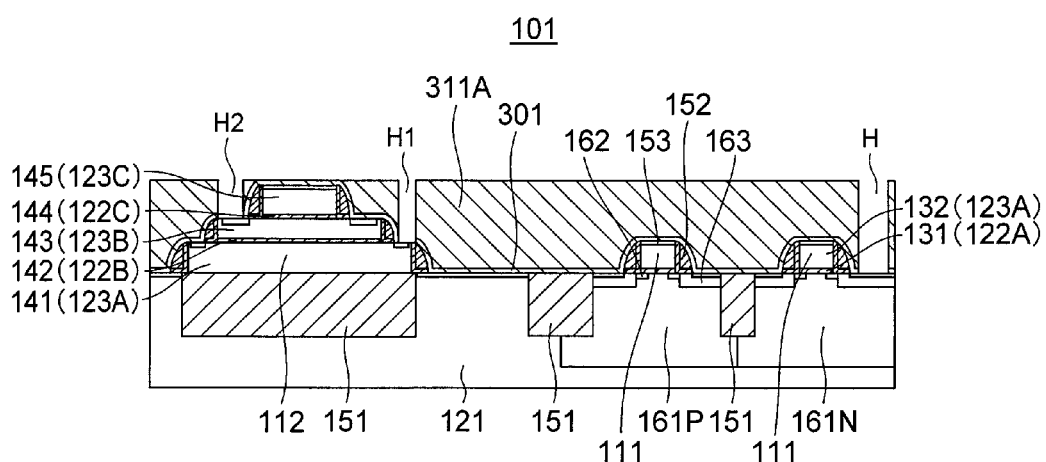

Next, an etch stopper 301 of silicon nitride and a first inter layer dielectric 311A of silicon oxide are deposited over the entire surface successively. Consequently, the transistors 111 and the capacitor 112 are covered by the etch stopper 301 and the first inter layer dielectric 311A. Then, the first inter layer dielectric 311A is planarized by CMP. Then, a contact hole for the transistors 111 (H), a contact hole for the first capacitor electrode 141 (H1), and a contact hole for the second capacitor electrode 143 (H2) are simultaneously formed in the first inter layer dielectric 311A by lithography and anisotropic etching. The anisotropic etching is continued until the etch stopper 301 is exposed. Then, the etch stopper 301 exposed in the contact holes H, H1, and H2 is removed by anisotropic etching. The anisotropic etching is continued until the metal silicide layers 153 are exposed. Consequently, the contact holes H, H1, and H2 are completed (FIG. 4G).

Figure 4H:
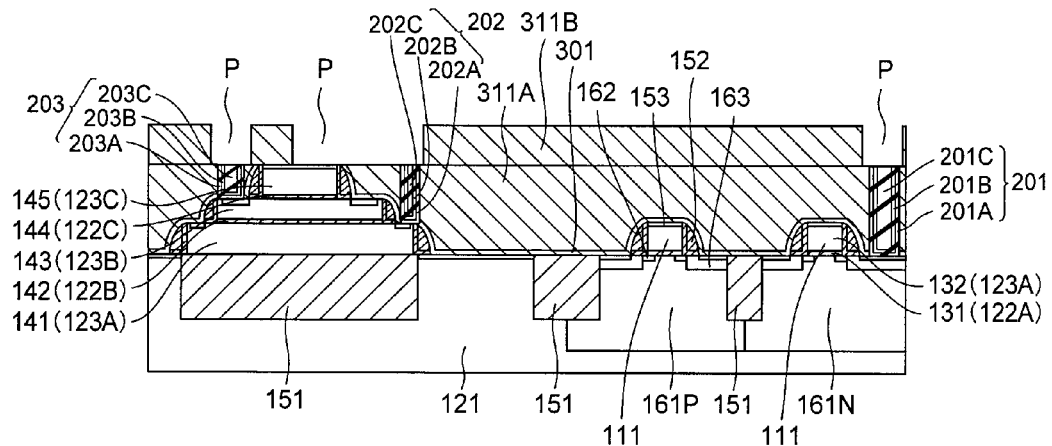
Figure 4:
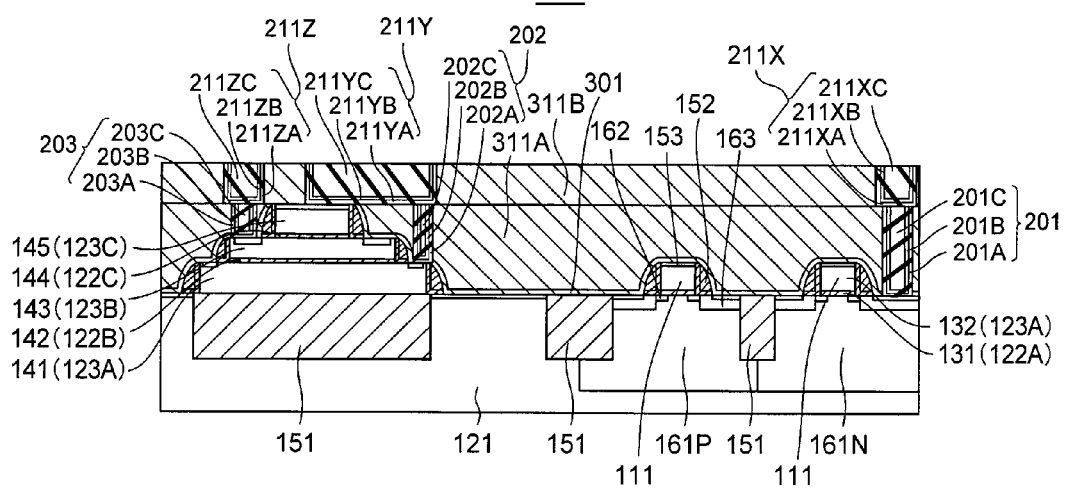

Next, contact plug material is embedded in the contact hole for the transistors 111 (H), the contact hole for the first capacitor electrode 141 (H1), and the contact hole for the second capacitor electrode 143 (H2). The contact plug material has a three-layer structure including a Ti layer deposited by sputtering, a TiN layer deposited by CVD, and a W layer deposited by CVD. Then, the contact plug material is planarized by CMP. Consequently, a contact plug 201 for the transistors 111, a contact plug 202 for the first capacitor electrode 141, and a contact plug 203 for the second capacitor electrode 143 are formed (FIG. 4H).

Next, a second inter layer dielectric 311B of silicon oxide is deposited over the entire surface. Consequently, the contact plug 201 for the transistors 111, the contact plug 202 for the first capacitor electrode 141, and the contact plug 203 for the second capacitor electrode 143 are covered by the second inter layer dielectric 311B. Then, the second inter layer dielectric 311B is patterned by lithography and anisotropic etching. Consequently, line trench patterns P which expose the contact plug 201 for the transistors 111, the contact plug 202 for the first capacitor electrode 141, the contact plug 203 for the second capacitor electrode 143, and the third capacitor electrode 145 (specifically, the metal silicide layer 153 of the third capacitor electrode 145), is formed in the second inter layer dielectric 311B (FIG. 4H).

In this embodiment, the metal silicide layer 153 is formed on the surface of the third capacitor electrode 145. However, according to another embodiment, the metal silicide layer 153 does not have to be formed on the surface of the third capacitor electrode 145. This is because CMP polishing speed for polysilicon included in the third capacitor electrode 145 is lower than CMP polishing speed for silicon oxide included in the first and second inter layer dielectrics 311A and 311B.

Next, line material is embedded in the line trench patterns P. The embedded line material has a three-layer structure including a Ta layer deposited by sputtering, a Cu layer deposited as a seed layer for plating, and a Cu layer deposited by plating. Then, the Cu layers are shrunk by heat treatment under the temperature of about 300 degrees Celsius to densify the Cu layers. Then, the line material is planarized by CMP. Consequently the line patterns 211 (211X to 211Z) are formed from the line material (FIG. 4I).

In this way, the transistors 111 and the capacitor 112 are mounted on the identical substrate 121. In this embodiment, the capacitor 112 is a multilayer capacitor including three capacitor electrode layers and two capacitor insulating layers. Compared with a single-layer capacitor which includes two capacitor electrode layers and one capacitor insulating layer, the multilayer capacitor 112 has a smaller occupied area but has a larger height. Consequently, if the multilayer capacitor 112 having a larger height than the single-layer capacitor is manufactured by a conventional method (see JP-A 2000-357773 (KOKAI)), difficulty in contact processing comes to be a problem.

Therefore, in this embodiment, the third capacitor electrode 145 and the line patterns 211 are directly connected. In other words, the third capacitor electrode 145 and the line patterns 211 are connected without a contact plug. Therefore, in this embodiment, in advance of forming the contact holes for the transistors 111 and the capacitor 112 (H, H1, and H2), it is possible to planarize the first inter layer dielectric 311A until the third capacitor electrode 145 is exposed, or until immediately before the third capacitor electrode 145 is exposed (see FIG. 4G). Consequently, in this embodiment, it is possible to reduce differences of aspect differences between the contact hole H and the contact holes H1 and H2. Consequently, in this embodiment, it is possible to process the contact holes H, H1, and H2 simultaneously, which can simplify the manufacturing process of the semiconductor device 101 (see FIG. 4G). Further, in this embodiment, since the line patterns 211 are formed by damascene, it is easy to form a flat line having little step, and it is easy to adopt line material suitable for plating, such as Cu.

The line trench patterns P in FIG. 4G is formed only in the second inter layer dielectric 311B in a case, and is formed in the second and first inter layer dielectrics 311B and 311A in another case. An example of the former case includes a case in which the first inter layer dielectric 311A is planarized until the third capacitor electrode 145 is exposed. An example of the latter case includes a case in which the first inter layer dielectric 311A is planarized until immediately before the third capacitor electrode 145 is exposed.

Third Embodiment

Figure 5:
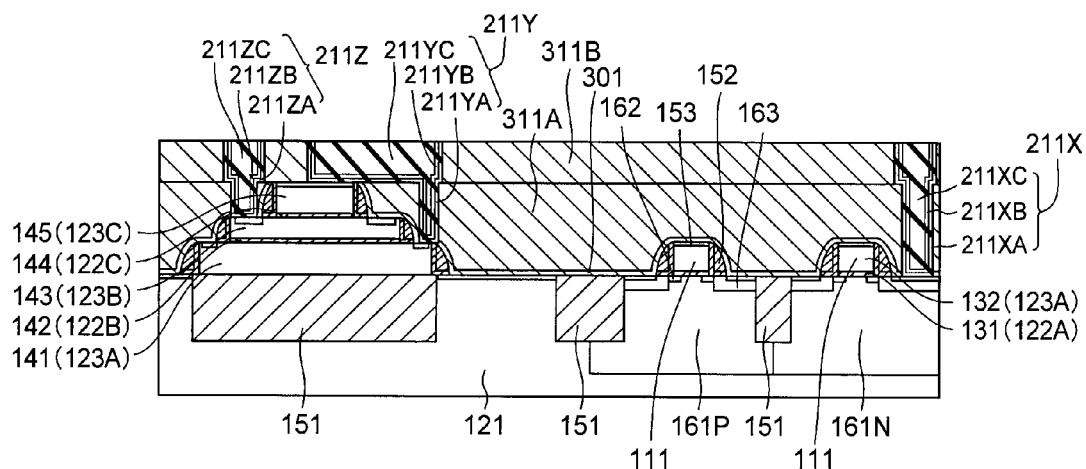
FIG. 5 is a side sectional view of a semiconductor device according to a third embodiment.

FIG. 5 is a side sectional view of a semiconductor device 101 according to a third embodiment. The semiconductor device 101 in FIG. 5 includes transistors 111 and a capacitor 112.

The semiconductor device 101 includes a substrate 121, a first insulating layer 122A, a first electrode layer 123A, a second insulating layer 122B, a second electrode layer 123B, a third insulating layer 122C, and a third electrode layer 123C.

Each of the transistors 111 includes a gate insulator 131 formed of the first insulating layer 122A, and a gate electrode 132 formed of the first electrode layer 123A. The capacitor 112 includes a first capacitor electrode 141 formed of the first electrode layer 123A, a first capacitor insulator 142 formed of the second insulating layer 122B, a second capacitor electrode 143 formed of the second electrode layer 123B, a second capacitor insulator 144 formed of the third insulating layer 122C, and a third capacitor electrode 145 formed of the third electrode layer 123C.

The semiconductor device 101 further includes line patterns 211 which serve as a contact plug for the transistors 111, a contact plug for the first capacitor electrode 141, and a contact plug for the second capacitor electrode 143, and are in contact with the third capacitor electrode 145. The line patterns 211 includes the line pattern 211X which serves as the contact plug for the transistors 111, the line pattern 211Y which serves as the contact plug for the first capacitor electrode 141 and is in contact with the third capacitor electrode 145, and the line pattern 211Z which serves as the contact plug for the second capacitor electrode 143.

Each of the line patterns 211 has a three-layer laminated structure (barrier metal layer/seed layer/metal layer) from its bottom surfaces and sidewall surfaces. The barrier metal layers are denoted by 211XA, 211YA, and 211ZA. The seed layers are denoted by 211XB, 211YB, and 211ZB. The metal layers are denoted by 211XC, 211YC, and 211ZC. The barrier metal layers in this embodiment are Ta (tantalum) layers. The seed layers in this embodiment are Cu (copper) layers. The metal layers in this embodiment are Cu (copper) layers. The line patterns 211 in this embodiment are dual damascene lines.

The first capacitor electrode 141 and the third capacitor electrode 145 constitute one electrode of the capacitor 112, and the second capacitor electrode 143 constitutes the other electrode of the capacitor 112. The first capacitor electrode 141 is supplied with potential from the line pattern 211Y directly. The second capacitor electrode 143 is supplied with potential from the line pattern 211Z directly. The third capacitor electrode 145 is supplied with potential from the line pattern 211Y directly. The first capacitor electrode 141 and the third capacitor electrode 145 is supplied with the same potential from the line pattern 211Y.

FIGS. 6A to 6H illustrate a manufacturing process of the semiconductor device 101 according to the third embodiment.

Figure 6A:
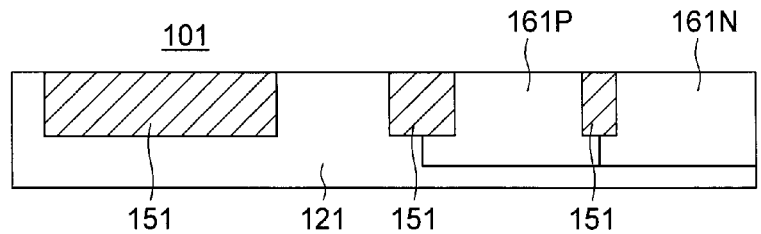
FIGS. 6A to 6H illustrate a manufacturing process of the semiconductor device according to the third embodiment.

First, an isolation layer 151 is formed on a substrate 121 which is the silicon substrate. Then, a p-well 161P and an n-well 161N are formed in the substrate 121 (FIG. 6A).

Figure 6B:
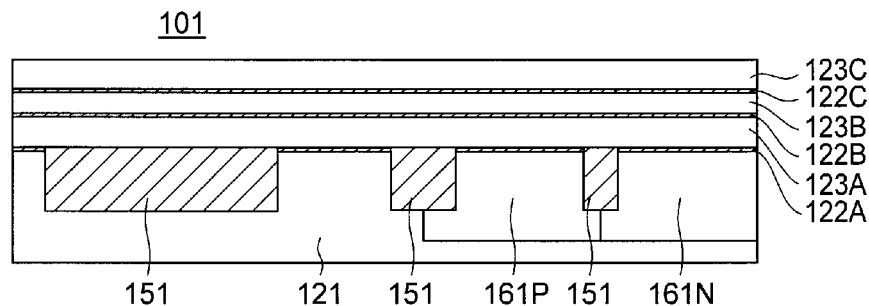

Next, a first insulating layer 122A of silicon oxide is deposited on the substrate 121, and a first electrode layer 123A of polysilicon is deposited on the first insulating layer 122A. Then, a second insulating layer 122B which includes a silicon oxide layer, a silicon nitride layer, and a silicon oxide layer deposited successively, is formed on the first electrode layer 123A, and a second electrode layer 123B of polysilicon is deposited on the second insulating layer 122B. Then, a third insulating layer 122C which includes a silicon oxide layer, a silicon nitride layer, and a silicon oxide layer deposited successively, is formed on the second electrode layer 123B, and a third electrode layer 123C of polysilicon is deposited on the third insulating layer 122C (FIG. 6B).

Figure 6C:
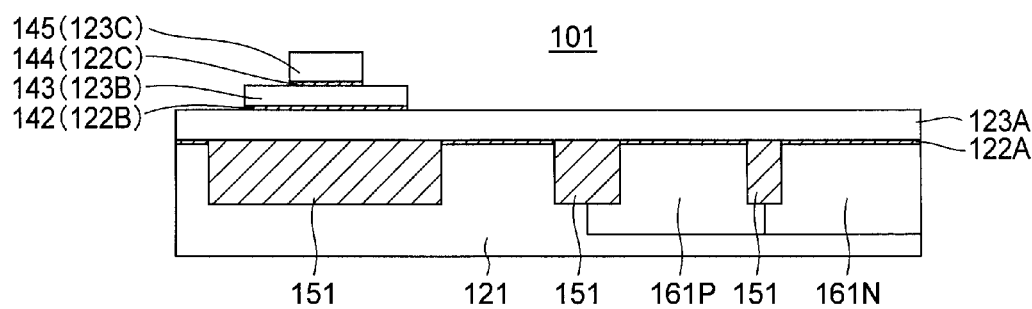

Next, the third electrode layer 123C is patterned by lithography and anisotropic etching. Consequently, the third electrode layer 123C is processed, and a third capacitor electrode 145 is formed from the third electrode layer 123C. Then, the exposed third insulating layer 122C is removed by wet etching using HF chemical and phosphoric acid. Consequently, the third insulating layer 122C is processed, and a second capacitor insulator 144 is formed (FIG. 6C).

Next, the second electrode layer 123B is patterned by lithography and anisotropic etching. Consequently, the second electrode layer 123B is processed, and the second capacitor electrode 143 is formed from the second electrode layer 123B. Then, the exposed second insulating layer 122B is removed by wet etching using HF chemical and phosphoric acid. Consequently, the second insulating layer 122B is processed, and a first capacitor insulator 142 is formed (FIG. 6C).

Figure 6D:
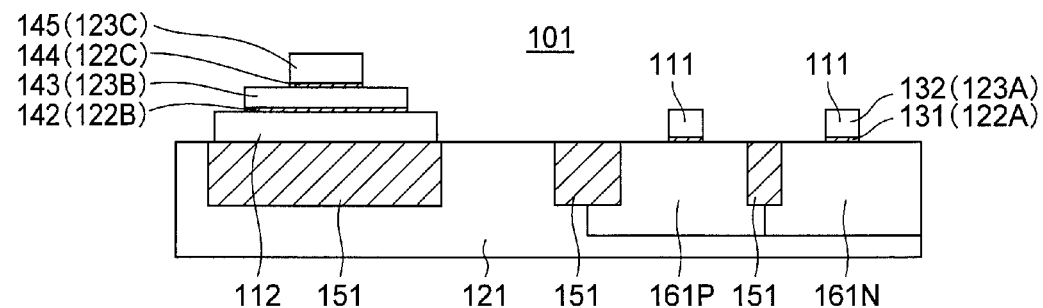

Next, the first electrode layer 123A is patterned by lithography and anisotropic etching. Consequently, the first electrode layer 123A is processed, and a first capacitor electrode 141 and gate electrodes 132 are formed from the first electrode layer 123A. Then, the exposed first insulating layer 122A is removed by wet etching using HF chemical. Consequently, the first insulating layer 122A is processed, and gate insulators 131 are formed (FIG. 6D).

According to the process described above, transistors 111 are formed on the wells 161, and a capacitor 112 is formed on the isolation layer 151. In FIG. 6D, a pMOSFET is formed on the p-well 161P, and an nMOSFET is formed on the n-well 161N.

Figure 6E:
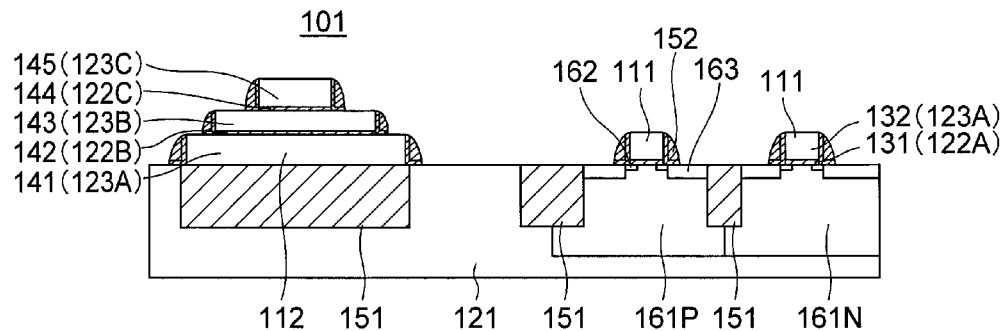

Next, extension diffusion layers 162 are formed in the wells 161. Then, sidewall spacers 152 are formed. Then, source/drain diffusion layers 163 are formed in the wells 161 (FIG. 6E).

Figure 6F:
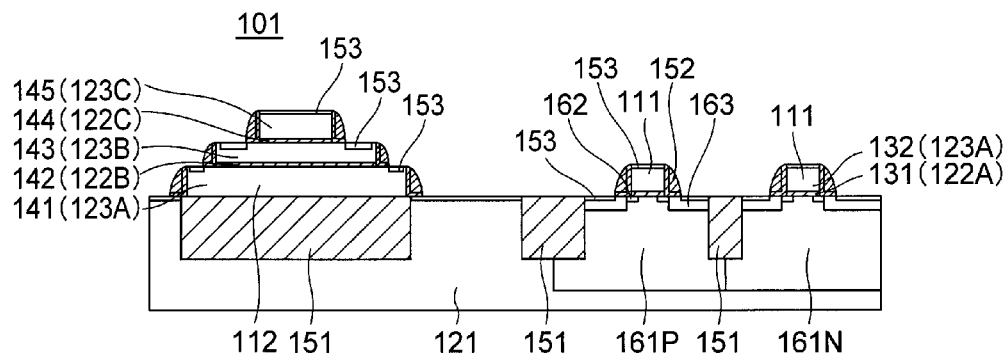

Next, the source/drain diffusion layers 163, the gate electrodes 132, the first capacitor electrode 141, the second capacitor electrode 143, and the third capacitor electrode 145 are exposed by wet etching using HF chemical. Then, metal silicide layers 153 are formed (self-aligned) on the surfaces of the source/drain diffusion layers 163, the gate electrodes 132, the first capacitor electrode 141, the second capacitor electrode 143, and the third capacitor electrode 145 (FIG. 6F).

Next, an etch stopper 301 of silicon nitride and a first inter layer dielectric 311A of silicon oxide are deposited over the entire surface successively. Consequently, the transistors 111 and the capacitor 112 are covered by the etch stopper 301 and the first inter layer dielectric 311A. Then, the first inter layer dielectric 311A is planarized by CMP. Then, a second inter layer dielectric 311B of silicon oxide is deposited over the entire surface. Consequently, the transistors 111 and the capacitor 112 are covered by the etch stopper 301, the first inter layer dielectric 311A, and the second inter layer dielectric 311B (FIG. 6G).

Next, a contact hole for the transistors 111 (H), a contact hole for the first capacitor electrode 141 (H1), and a contact hole for the second capacitor electrode 143 (H2) are simultaneously formed in the second and first inter layer dielectric 311B and 311A by lithography and anisotropic etching. The anisotropic etching is continued until the etch stopper 301 is exposed. Then, the etch stopper 301 exposed in the contact holes H, H1, and H2 is removed by anisotropic etching. The anisotropic etching is continued until the metal silicide layers 153 are exposed. Consequently, the contact holes H, H1, and H2 are completed (FIG. 6G).

Figure 6G:
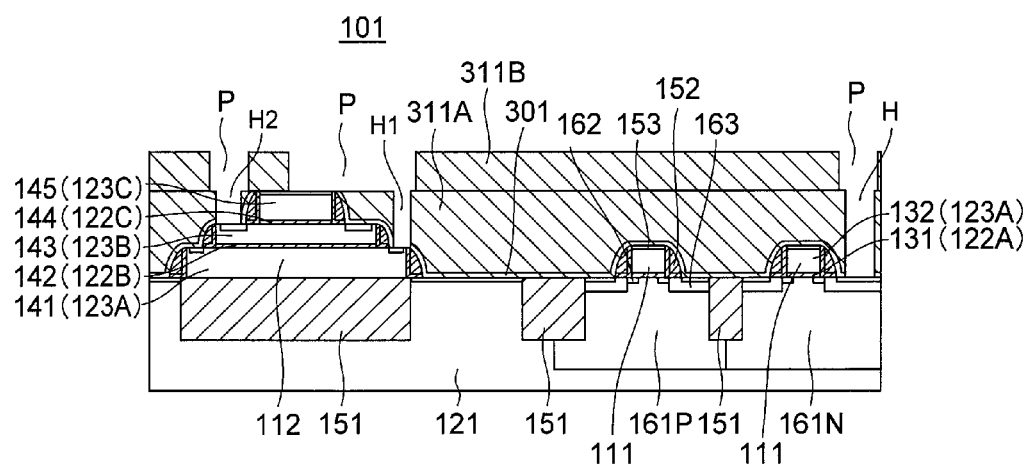

Next, trench patterns P which expose the third capacitor electrode 145 (specifically, the metal silicide layer 153 of the third capacitor electrode 145) is formed in the second inter layer dielectric 311B by lithography and anisotropic etching (FIG. 6G).

In this embodiment, the metal silicide layer 153 is formed on the surface of the third capacitor electrode 145. However, according to another embodiment, the metal silicide layer 153 does not have to be formed on the surface of the third capacitor electrode 145. This is because CMP polishing speed for polysilicon included in the third capacitor electrode 145 is lower than CMP polishing speed for silicon oxide included in the first and second inter layer dielectrics 311A and 311B.

Figure 6H:
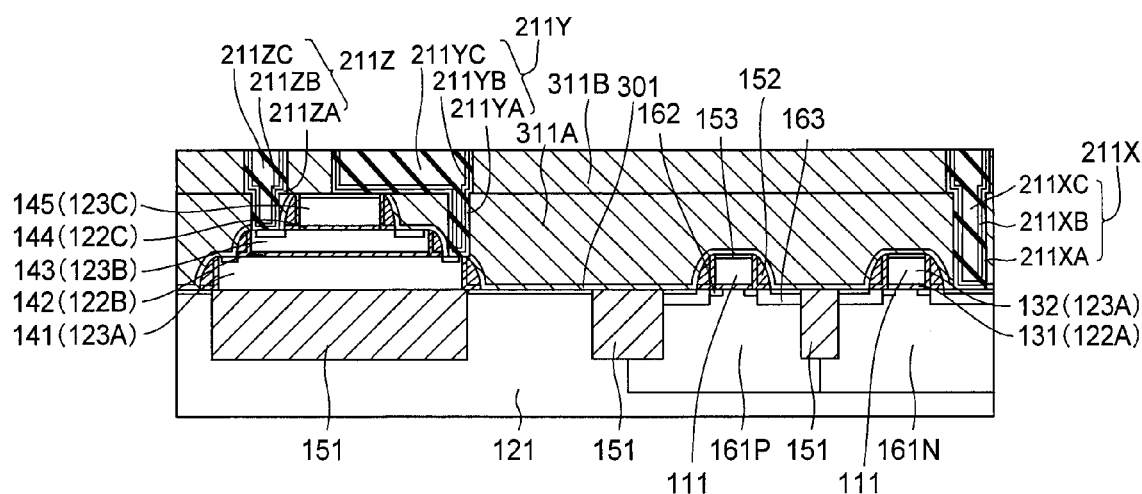

Next, line material is embedded in the contact hole for the transistors 111 (H), the contact hole for the first capacitor electrode 141 (H1), the contact hole for the second capacitor electrode 143 (H2), and the line trench patterns P. The embedded line material has a three-layer structure including a Ta layer deposited by sputtering, a Cu layer deposited as a seed layer for plating, and a Cu layer deposited by plating. Then, the Cu layers are shrunk by heat treatment under the temperature of about 300 degrees Celsius to densify the Cu layers. Then, the line material is planarized by CMP. Consequently, the line patterns 211 (211X to 211Z) are formed from the line material (FIG. 6H).

In this way the transistors 111 and the capacitor 112 are mounted on the identical substrate 121. In this embodiment, the capacitor 112 is a multilayer capacitor including three capacitor electrode layers and two capacitor insulating layers. Compared with a single-layer capacitor which includes two capacitor electrode layers and one capacitor insulating layer, the multilayer capacitor 112 has a smaller occupied area but has a larger height. Consequently, if the multilayer capacitor 112 having a larger height than the single-layer capacitor is manufactured by a conventional method (see JP-A 2000-357773 (KOKAI)), difficulty in contact processing comes to be a problem.

Therefore, in this embodiment, a contact structure similar to those in the first and second embodiments is formed by dual damascene. In other words, the line patterns 211 in this embodiment has a structure that serves as the contact plugs 201, 202, and 203 and the line patterns 211 in the first and second embodiments (see FIG. 6H). Consequently, in this embodiment, it is possible to reduce differences of aspect differences between the contact hole H and the contact holes H1 and H2. Consequently, in this embodiment, it is possible to process the contact holes H, H1, and H2 simultaneously, which can simply the manufacturing process of the semiconductor device 101 (see FIG. 6G). Further, in this embodiment, since the line patterns 211 are formed by damascene, it is easy to form a flat line having little step, and it is easy to adopt line material suitable for plating, such as Cu. Moreover, in this embodiment, since the line patterns 211 are formed by dual damascene, the process of forming the contact plugs and the process of forming the line patterns are unified.

The line trench patterns P in FIG. 6G is formed only in the second inter layer dielectric 311B in a case, and is formed in the second and first inter layer dielectric 311B and 311A in another case. An example of the former case includes a case in which the first inter layer dielectric 311A is planarized until the third capacitor electrode 145 is exposed. An example of the latter case includes a case in which the first inter layer dielectric 311A is planarized until immediately before the third capacitor electrode 145 is exposed.

In this embodiment, the inter layer dielectric covering the transistors 111 and the capacitor 112 includes the first and second inter layer dielectrics 311A and 311B, and is formed by performing deposition process twice separately. However, the inter layer dielectric may be formed by performing deposition process once collectively.

As described above, with regard to a semiconductor device including a transistor and a capacitor and a method of manufacturing the semiconductor device, the embodiments of the present invention provide a technique for realizing a suitable contact processing.

The invention claimed is:

1. A method of manufacturing a semiconductor device, the method comprising:
   depositing a first insulating layer on a substrate;
   depositing a first electrode layer on the first insulating layer;
   depositing a second insulating layer on the first electrode layer;
   depositing a second electrode layer on the second insulating layer;
   depositing a third insulating layer on the second electrode layer;
   depositing a third electrode layer on the third insulating layer;
   processing the first to third insulating layers and the first to third electrode layers to form
      a transistor including:
         a gate insulator formed of the first insulating layer, and
         a gate electrode formed of the first electrode layer, and
      a capacitor including:
         a first capacitor electrode formed of the first electrode layer,
         a first capacitor insulator formed of the second insulating layer,
         a second capacitor electrode formed of the second electrode layer,
         a second capacitor insulator formed of the third insulating layer, and
         a third capacitor electrode formed of the third electrode layer;
   forming self-aligned silicide layers on surfaces of the gate electrode and the third capacitor electrode;
   depositing an inter layer dielectric that covers the transistor and the capacitor;
   forming, in the inter layer dielectric, a contact hole for the transistor, a contact hole for the first capacitor electrode, and a contact hole for the second capacitor electrode;
   embedding contact plug material in the contact hole for the transistor, the contact hole for the first capacitor electrode, and the contact hole for the second capacitor electrode;
   planarizing the contact plug material to form a contact plug for the transistor, a contact plug for the first capacitor electrode, and a contact plug for the second capacitor electrode and to expose the silicide layer on the third capacitor electrode;
   depositing a line layer that covers the contact plug for the transistor, the contact plug for the first capacitor electrode, the contact plug for the second capacitor electrode, and the silicide layer on the third capacitor electrode; and
   processing the line layer to form line patterns formed of the line layer.

2. The method according to claim 1, wherein the first and third capacitor electrodes constitute one electrode of the capacitor, and the second capacitor electrode constitutes the other electrode of the capacitor.

3. The method according to claim 1, wherein the capacitor is formed on an isolation layer.

4. The method according to claim 1, wherein the transistor is formed on a well.

5. The method according to claim 1, wherein an etch stopper is deposited on the transistor and the capacitor, and the inter layer dielectric is deposited on the etch stopper.

6. The method according to claim 1, wherein
   the self-aligned silicide layers are formed on surfaces of the substrate, the gate electrode, and the first to third capacitor electrodes,
   the contact plug for the transistor is formed on the silicide layer on the substrate,
   the contact plug for the first capacitor electrode is formed on the silicide layer on the first capacitor electrode, and
   the contact plug for the second capacitor electrode is formed on the silicide layer on the second capacitor electrode.

7. The method according to claim 1, wherein each of the second and third insulating layers is a multilayer insulator including two or more insulating layers.

8. The method according to claim 1, wherein each of the first to third electrode layers is a polysilicon layer or a metal layer.

9. The method according to claim 1, wherein impurities are doped in each of the first to third electrode layers.

10. A method of manufacturing a semiconductor device, the method comprising:
   depositing a first insulating layer on a substrate;
   depositing a first electrode layer on the first insulating layer;
   depositing a second insulating layer on the first electrode layer;
   depositing a second electrode layer on the second insulating layer;
   depositing a third insulating layer on the second electrode layer;
   depositing a third electrode layer on the third insulating layer;
   processing the first to third insulating layers and the first to third electrode layers to form
      a transistor including:
         a gate insulator formed of the first insulating layer, and
         a gate electrode formed of the first electrode layer, and
      a capacitor including:
         a first capacitor electrode formed of the first electrode layer,
         a first capacitor insulator formed of the second insulating layer,
         a second capacitor electrode formed of the second electrode layer,
         a second capacitor insulator formed of the third insulating layer, and
         a third capacitor electrode formed of the third electrode layer;
   forming self-aligned silicide layers on surfaces of the gate electrode and the third capacitor electrode;
   depositing a first inter layer dielectric that covers the transistor and the capacitor;
   forming, in the first inter layer dielectric, a contact hole for the transistor, a contact hole for the first capacitor electrode, and a contact hole for the second capacitor electrode;
   embedding contact plug material in the contact hole for the transistor, the contact hole for the first capacitor electrode, and the contact hole for the second capacitor electrode;

planarizing the contact plug material to form a contact plug for the transistor, a contact plug for the first capacitor electrode, and a contact plug for the second capacitor electrode;

depositing a second inter layer dielectric that covers the contact plug for the transistor, the contact plug for the first capacitor electrode, and the contact plug for the second capacitor electrode;

forming, in the second inter layer dielectric, line trench patterns for exposing the contact plug for the transistor, the contact plug for the first capacitor electrode, the contact plug for the second capacitor electrode, and the silicide layer on the third capacitor electrode;

embedding line material in the line trench patterns to form the line material on the silicide layer on the third capacitor electrode; and planarizing the line material to form line patterns formed of the line material.

11. The method according to claim 10, wherein the first and third capacitor electrodes constitute one electrode of the capacitor, and the second capacitor electrode constitutes the other electrode of the capacitor.

12. The method according to claim 10, wherein the self-aligned silicide layers are formed on surfaces of the substrate, the gate electrode, and the first to third capacitor electrodes, the contact plug for the transistor is formed on the silicide layer on the substrate, the contact plug for the first capacitor electrode is formed on the silicide layer on the first capacitor electrode, and the contact plug for the second capacitor electrode is formed on the silicide layer on the second capacitor electrode.

13. A method of manufacturing a semiconductor device, the method comprising:

depositing a first insulating layer on a substrate;

depositing a first electrode layer on the first insulating layer;

depositing a second insulating layer on the first electrode layer;

depositing a second electrode layer on the second insulating layer;

depositing a third insulating layer on the second electrode layer;

depositing a third electrode layer on the third insulating layer;

processing the first to third insulating layers and the first to third electrode layers to form a transistor including:
  a gate insulator formed of the first insulating layer, and
  a gate electrode formed of the first electrode layer, and a capacitor including:
  a first capacitor electrode formed of the first electrode layer,
  a first capacitor insulator formed of the second insulating layer,
  a second capacitor electrode formed of the second electrode layer,
  a second capacitor insulator formed of the third insulating layer, and
  a third capacitor electrode formed of the third electrode layer;

forming self-aligned silicide layers on surfaces of the gate electrode and the third capacitor electrode;

depositing one or more inter layer dielectrics that cover the transistor and the capacitor;

forming, in the one or more inter layer dielectrics, a contact hole for the transistor, a contact hole for the first capacitor electrode, and a contact hole for the second capacitor electrode;

forming, in the one or more inter layer dielectrics, line trench patterns for exposing the silicide layer on the third capacitor electrode;

embedding line material in the contact hole for the transistor, the contact hole for the first capacitor electrode, the contact hole for the second capacitor electrode, and the line trench patterns to form the line material on the silicide layer on the third capacitor electrode; and planarizing the line material to form line patterns formed of the line material.

14. The method according to claim 13, wherein the first and third capacitor electrodes constitute one electrode of the capacitor, and the second capacitor electrode constitutes the other electrode of the capacitor.

15. The method according to claim 13, wherein the self-aligned silicide layers are formed on surfaces of the substrate, the gate electrode, and the first to third capacitor electrodes, the contact hole for the transistor, the contact hole for the first capacitor electrode, and the contact hole for the second capacitor electrode are formed to expose the silicide layers on the substrate, on the first capacitor electrode, and on the second capacitor electrode, respectively, and the line material is formed on the silicide layers on the substrate, and the first to third capacitor electrodes.

16. A semiconductor device comprising:

a transistor including:
  a gate insulator formed of an insulating layer deposited on a substrate, and
  a gate electrode formed of an electrode layer deposited on the insulating layer, and including a silicide layer formed on a surface of the gate electrode;

a capacitor including:
  a first capacitor electrode formed of the electrode layer,
  a first capacitor insulator formed on the first capacitor electrode,
  a second capacitor electrode formed on the first capacitor insulator,
  a second capacitor insulator formed on the second capacitor electrode, and
  a third capacitor electrode formed on the second capacitor insulator, and including a silicide layer formed on a surface of the third capacitor electrode;

a contact plug for the transistor;

a contact plug for the first capacitor electrode;

a contact plug for the second capacitor electrode; and line patterns which are in contact with the contact plug for the transistor, the contact plug for the first capacitor electrode, the contact plug for the second capacitor electrode, and the silicide layer on the third capacitor electrode.

17. A semiconductor device comprising:

a transistor including:
  a gate insulator formed of an insulating layer deposited on a substrate, and
  a gate electrode formed of an electrode layer deposited on the insulating layer, and including a silicide layer formed on a surface of the gate electrode;

a capacitor including:
  a first capacitor electrode formed of the electrode layer,
  a first capacitor insulator formed on the first capacitor electrode, a second capacitor electrode formed on the first capacitor insulator, a second capacitor insulator formed on the second capacitor electrode, and a third capacitor electrode formed on the second capacitor insulator, and including a silicide layer formed on a surface of the third capacitor electrode; and line patterns which serve as a contact plug for the transistor, a contact plug for the first capacitor electrode, and a contact plug for the second capacitor electrode, and are in contact with the silicide layer on the third capacitor electrode.

* * * * *